United States Patent
Prado

(10) Patent No.: US 6,977,503 B2
(45) Date of Patent: Dec. 20, 2005

(54) SYSTEM AND METHOD FOR SINGLE-SIDED MAGNETIC RESONANCE IMAGING

(75) Inventor: Pablo J. Prado, San Diego, CA (US)

(73) Assignee: Quantum Magnetics, Inc., San Diego, CA (US)

( * ) Notice: Subject to any disclaimer, the term of this patent is extended or adjusted under 35 U.S.C. 154(b) by 47 days.

(21) Appl. No.: 10/361,410

(22) Filed: Feb. 10, 2003

(65) Prior Publication Data

US 2004/0155659 A1 Aug. 12, 2004

(51) Int. Cl.$^7$ ................................................. G01V 3/00
(52) U.S. Cl. ....................................... 324/319; 324/320
(58) Field of Search ................................ 324/319, 320, 324/318, 322, 300, 306, 307, 309

(56) References Cited

U.S. PATENT DOCUMENTS

| | | | | |
|---|---|---|---|---|
| 5,331,282 A | * | 7/1994 | McDougall et al. | 324/319 |
| 5,390,673 A | * | 2/1995 | Kikinis | 600/410 |
| 5,959,454 A | | 9/1999 | Westphal et al. | |
| 6,091,241 A | * | 7/2000 | Querleux et al. | 324/300 |
| 6,208,142 B1 | * | 3/2001 | Wagshul | 324/319 |
| 6,489,767 B1 | * | 12/2002 | Prado et al. | 324/318 |

OTHER PUBLICATIONS

G.A. Matzkanin, "A Review of Nondestructive Characterization of Composites Using NMR", 1989, pp. 655–669, Springer, Berlin.

G. Eidmann et al., "The NMR Mouse, a Mobile Universal Surface Explorer", J. Mag. Reson., 1996, pp. 104–109, Series A 122, Article No. 0185.

R.L. Kleinberg et al., "Novel NMR Apparatus for Investigating an External Sample", J. Mag. Reson., 1992. pp. 466–485. vol. 97.

A. Sezginer, "RF Sensor of a Novel NMR Apparatus", J. Electromagnetic Waves and Applications, 1993, pp. 13–30, vol. 7, No. 1.

P.J. Prado et al., "One–dimensional imaging with a PalmSize Probe", J. Magn. Reson., 2000, pp. 200–206, vol. 144.

B. Blümich et al., "The NMR–Mouse: Construction, Excitation, and Applications", Mag. Reson. Imaging, 1998, pp. 479–484, vol. 16, Nos. 5/6.

M. Rokitta et al., "Portable Nuclear Magnetic Resonance Imaging System". Rev. Sci. Instrum., Nov. 2000, pp. 4257–4262, vol. 71, No. 11.

P. J. Prado et al., "MRI with a Palm–Size Probe", 5$^{th}$ Intl. Conf. Mag. Res. Micro., German Cancer Research Center, Heidelberg, Sep. 1999, pp. 1–3.

* cited by examiner

Primary Examiner—Louis Arana

(57) ABSTRACT

A magnetic resonance imaging apparatus and method having a magnet assembly, which provides substantially flat surfaces of constant magnetic field outside the assembly and a set of magnetic field gradients. One-, two-, and three-dimensional images are rendered. The static magnetic field is virtually uniform within horizontal degrees of freedom and decreases monotonically in a direction away from the surface. An RF probe, for example, a coil, located adjacent the surface, produces a field substantially perpendicular to the static magnetic field. A magnetic field gradient is set to horizontally scan a given level within the sensitive volume. Received magnetic resonance signals are detected by the coil for a depth corresponding to the excitation frequency. As the tuning and excitation frequency is switched to lower values, signals are generated for layers progressively farther from the surface. The RF probe is automatically tuned. Depth profiles are rendered by concatenating the signals collected at various frequencies. Horizontal resolution is attained by the use of controlled magnetic field gradients.

24 Claims, 4 Drawing Sheets

SYSTEM AND METHOD FOR SINGLE-SIDED MAGNETIC RESONANCE IMAGING

BACKGROUND OF THE INVENTION

1. Field of the Invention

Embodiments of the present invention relate generally to magnetic resonance imaging, and more particularly to a method and apparatus for producing one-, two- and three-dimensional imaging employing a single-sided magnet and a dedicated radio-frequency coil.

2. Discussion of Related Art

In conventional magnetic resonance imaging (MRI), a scanned sample, which may be a patient or a sample of inanimate material, is placed in a substantially uniform, temporally constant main magnetic field within a defined volume. For purposes of the present description, the volume within which meaningful results will be produced is referred to as the sensitive volume. The magnetic field causes nuclear spins within the sample to effectively line up parallel to the field direction. This orientation is permuted by exciting those nuclei with one or many radio-frequency (RF) pulses. As these excited nuclei realign to the external magnetic field, they emit a radio-frequency signal that is detected by a receiver coil. The frequency of the signal the nuclei emit depends on the composition of the nucleus, its surrounding material and on the strength of the external magnetic field. A map of detected nuclei density within the sensitive volume is generated by using non-uniform magnetic fields.

In "single-sided" or unilateral magnetic resonance (MR), the magnetic field is provided in a region outside the probing head by a permanent magnet, an electromagnet or a superconducting magnet. Relatively recent developments in magnetic resonance apparatus have led to the development of devices, which are suitable to a wide variety of measurement applications.

Particularly interesting examples of portable MR devices are described in G. A. Matzkanin, *A Review of Nondestructive Characterization of Composites Using NMR* in (*Nondestructive Characterization of Materials*, Springer, Berlin), pp. 655–669 (1989), and in G. Eidmann et al., *The NMR MOUSE, a Mobile Universal Surface Explorer*, J. Mag. Reson. Series A 122, pp. 104–109 (1996). In this apparatus, a horseshoe magnet extending horizontally comprises north and south poles separated by a gap extending in a transverse horizontal direction. An RF coil is located in the gap between the magnet poles. The size of the sensitive volume is determined by the duration of radio frequency pulses and the magnetic field distribution. The resonance frequency of the RF circuit is either fixed, or it can be tuned over a narrow frequency range. If the frequency is shifted without proper retuning, the received signal degrades rapidly.

Other examples of field-deployable single-sided MR apparatus are described in R. L. Kleinberg et al., *Novel NMR Apparatus for Investigating an External Sample*, J. Mag. Reson. 97, pp. 466–485 (1992), and in A. Sezginer, *RF Sensor of a Novel NMR Apparatus*, J. Electromagnetic Waves and Applications 7, pp. 13–30 (1993). In this apparatus, the magnet blocks are shaped in order to produce relatively homogeneous fields in a region remote to the sensor unit.

Spatial resolution may be achieved over the sensitive volume of single-sided MR probes. Magnetic field gradient coils are used to control the field distribution and render images in the plane parallel to the probe surface. Spatial resolution along the gap of a device described in the two previous paragraphs was presented in P. J. Prado et al., *One-dimensional Imaging with a Palm-Size Probe*, J. Magn. Reson. 144, pp. 200–206 (2000). This instrument has provided a significant capability in providing spatial resolution using phase encoding MRI techniques over a space within the sensitive volume (U.S. Pat. No. 6,489,767).

The devices described above do not allow for effective depth resolution, due to their inherent magnetic field distribution. A frequency shift in the presence of non-flat surfaces of constant magnetic field is associated with a displacement of the sensitive volume with poor spatial resolution. The resonance frequency for these devices is fixed or tunable over a reduced range. Imaging techniques over a selected slice (constant depth) is described in U.S. Pat. No. 5,959,454.

SUMMARY OF THE INVENTION

Embodiments of the present invention provide a portable MRI device and method to measure material properties with spatial resolution in a non-invasive manner. The spatial resolution may be a depth profile or lateral (parallel to the sensor surface) resolution, or a combination of them, to render information in one, two, or three dimensions. Measurements may be made directly from the surface of the material under test. Embodiments of the invention include a dedicated array of permanent magnets to provide flat surfaces of substantially uniform magnetic field strength above and parallel to a surface of the array. The field is virtually uniform within horizontal degrees of freedom and decreases monotonically in a direction away from the surface. This direction is vertical or outward from the surface of the array within the framework of the present description, but may comprise any orientation when an instrument according to the present invention is utilized.

An RF probe, for example, a coil, located adjacent to the surface of the array produces a field perpendicular to the static magnetic field. Depth profiles are rendered by controlling the probe tuning and consequently shifting the resonance frequency. Two- and three-dimensional imaging is achieved using the depth profile method combined with phase encoding over the slice with a set of magnetic field gradient coils. As the frequency of the RF signal is switched to lower values, signals are generated from layers progressively farther from the surface. Automatic tuning to the radio frequency probe is preferably provided.

The ability for this apparatus to provide depth resolution enables it to have capability for many forms of non-invasive testing. These include: creating profiles of adipose tissue content (liposuction procedures); monitoring of skin pigmentation (tattoos); quantification of water in porous material; assessment of wood moisture content; analysis of concrete hydration, moisture content and curing; flow and diffusion measurements; and adsorption in zeolite beds, among others. The optional two- and three-dimensional imaging enables it to have capability for many other forms of testing and diagnosis. These include imaging of skin lesions such as melanomas, birthmarks and basal cell carcinomas, and polymeric materials, among others.

BRIEF DESCRIPTION OF THE DRAWING

The advantages and features of this invention will be more readily apparent from the following detailed description, when read in conjunction with the accompanying drawing, in which.

DETAILED DESCRIPTION OF THE PREFERRED EMBODIMENTS

Figure 1:
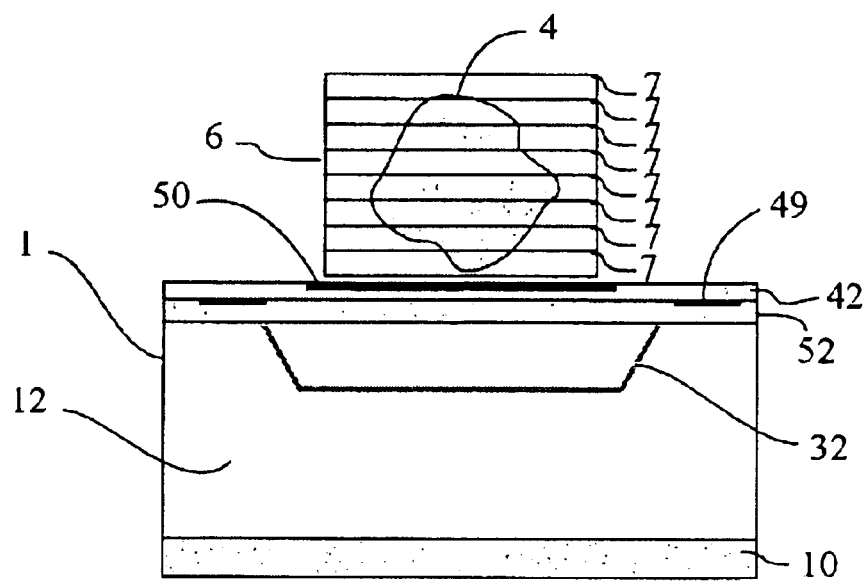
FIG. 1 is a schematic side view of an apparatus constructed in accordance with an embodiment of the present invention, illustrating a sensitive volume above the magnetic resonance probe head.

With reference now to the drawing, and more particularly to FIG. 1, single-sided MRI probe head 1 is illustrated. The MRI apparatus provides for analysis of sample 4 placed in a sensitive volume 6 on one side thereof. In the embodiment of FIG. 1, the sensitive volume is above the MRI probe head. It should be understood that the deployment of the present invention does not require any one particular spatial orientation. Sensitive volume 6 could indeed be below or beside the MRI apparatus. Relative orientations of the components of MRI probe head 1 and sample 4 to be analyzed are described below. The MRI probe head includes magnet assembly 12 and RF coil unit 50. For in-plane imaging, magnetic field gradient coils 48 and 49 (see FIG. 3) are used. In conjunction with FIG. 1, FIG. 2 is a plan view of magnet assembly 12, and FIG. 3 is a plan view of the RF coil 50 and gradient coils 48 and 49, together with a block diagram of the RF unit.

Figure 4:
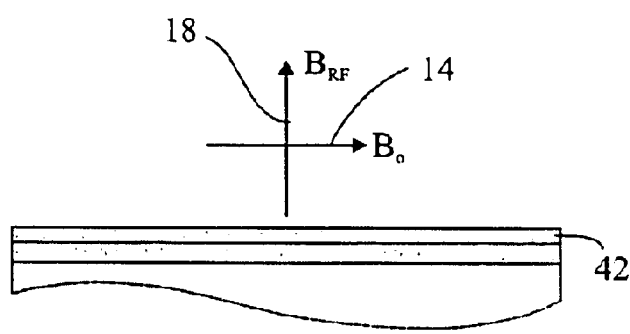
FIG. 4 is an illustration of a portion of the apparatus of FIG. 1 showing the direction of the static magnetic field ($B_0$) and RF field ($B_{RF}$) above the apparatus.

Magnet assembly 12 preferably comprises an open array of high-grade permanent magnets. Electromagnets could be used but these would require a DC power supply. In the preferred embodiment, a so-called dipole magnet configuration is utilized to provide strong magnetic fields above and parallel to the magnet assembly. With a dedicated magnet configuration and utilizing presently available permanent magnets, effectively flat surfaces of constant field can be generated over an area bounded by more than one half of the lateral dimensions of the magnet assembly. The magnetic field strength decreases monotonically with vertical or normal distance from the magnet assembly. In FIG. 4, line 14 represent the static magnetic field $B_0$ provided by magnet assembly 12. RF coil unit 50 provides RF field $B_{RF}$, illustrated by line 18, which is perpendicular to static magnetic field $B_0$. Alternative directions of the static and RF fields may be used for the single-sided method based on flat surfaces of constant field, as long as there is a component of the RF field perpendicular to the static field.

The magnetic resonance frequency of a nucleus in a sample under test is proportional to the static field strength $B_0$. Therefore, provision of one selected frequency from RF coil unit 50 in a relatively narrow bandwidth will produce a thin layer 7 of the sensitive volume 6. This thin layer may be regarded as a depth in one-dimensional MRI, or may be regarded as one plane or layer of a three-dimensional image. As frequency is changed, the system is tuned to different layers 7 of sensitive volume 6. Since the depth at which a response from a sample is obtained varies with excitation frequency, it is not necessary to move a sample when generating an image.

Figure 2:
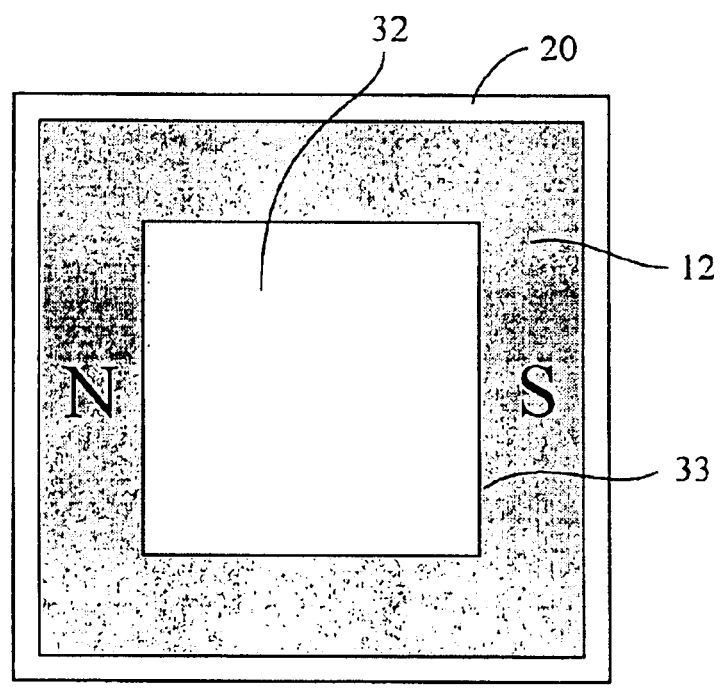
FIG. 2 is a plan view of the magnet assembly of the embodiment of FIG. 1.
Figure 3:
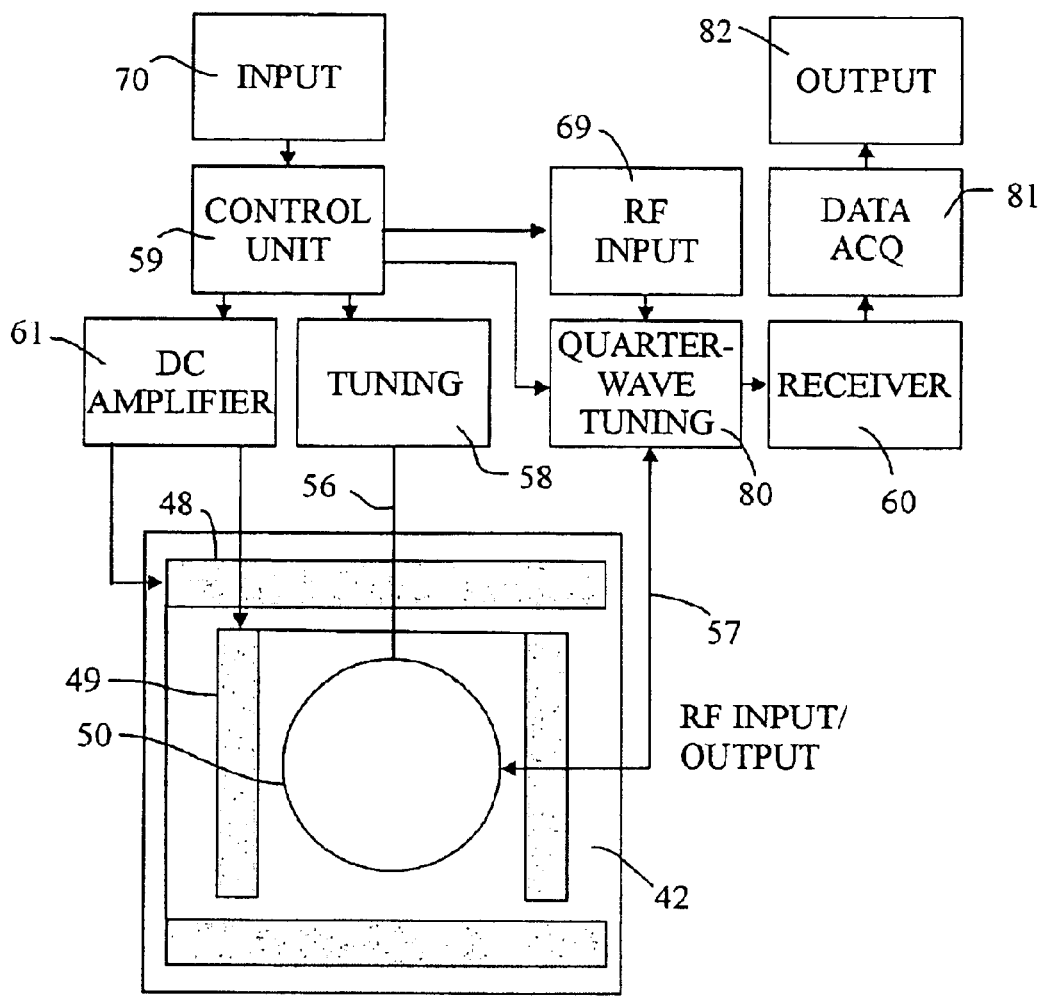
FIG. 3 is a plan view and block diagram of the RF unit in the embodiment of FIG. 1.

Turning to FIG. 2, magnet assembly 12 includes a square frame 20 in the present example. Other shapes may be provided. A set of magnet blocks 12 is configured to provide the desired static magnetic field distribution. The north (N) and south (S) poles of these magnet blocks are indicated. In this embodiment, central recess 32 is provided having an extent sufficient to reduce the effect of the proximity between RF coil 50 and magnet assembly 12. In the present case, the magnet array and recess are presented in a square shape, although other shapes may be used. The edge between top block surface 12 and recess 32 may be a vertical drop 33 or a gradual drop. FIG. 1 shows this as a gradual drop, with sloping surfaces from the top surface of magnet assembly 12 to the bottom of recess 32.

Magnet assembly 12 is shaped to affect a sensitive volume such as slices of sensitive volume 7 in FIG. 1. One skilled in the art can determined the extent of the sensitive volume with which magnet assembly 12 is effective by measurement of magnetic flux in each of a plurality of planes above the magnet assembly. The value of $B_0$ will be constant in each plane within the limits of tolerances selected for a given application. For the present configuration the magnet blocks constituting the array are magnetized and oriented in such way that the top of the magnet is mainly north on one side and mainly south on the opposite side. The individual permanent magnets in the array are magnetized and distributed to produce flat surfaces of constant field. In the presented configuration the magnets are positioned on magnetic plate 10, called the yoke. The assembling process is performed in such manner that the combined magnetization is predominantly parallel to the array. Other orientations may be used, but the RF and gradient coils need to be designed accordingly. A simple design has two antiparallel permanent magnet blocks and an RF coil in the gap.

Figure 5:
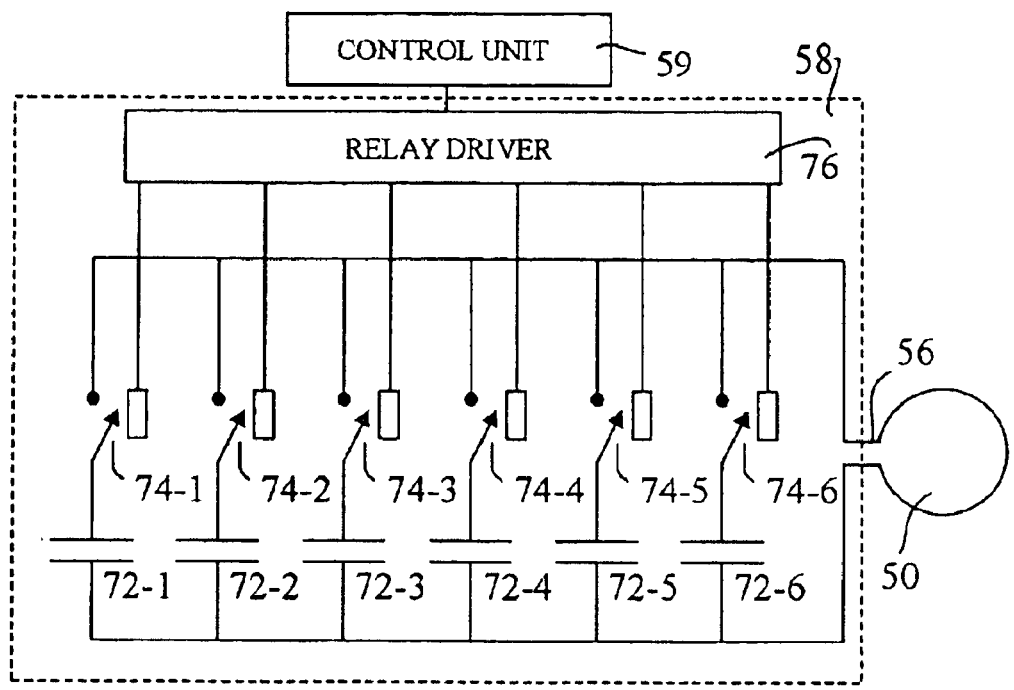
FIG. 5 is a schematic diagram of a tuning and control circuit of the RF unit in accordance with an embodiment of the invention.

As seen in FIG. 1, RF coil 50 and gradient coils 48 and 49 comprise layered probe supports 42 and 52, with support 52 resting on magnet assembly 12. The supports are made of a rigid, electrically non-conductive material. FIG. 3 includes a plan view of the probe support block. Support block 52 is dimensioned to fit between the magnet assembly and sensitive volume 6. Coil 50 is connected by cable 56 to tuning circuit 58. The tuning circuit is schematically illustrated in FIG. 5. Tuning circuit 58 may be interfaced for control by control unit 59. In the present embodiment the tuning circuit comprises a set of capacitors and controlled relays, but any other practical means of changing the tuning frequency in a controlled manner may be used. Control unit 59 also controls the current for magnetic field gradient coils 48 and 49 through DC amplifier 61. The gradient coils produce a non-uniform magnetic field with strength controlled by the DC amplifier current. For the preferred setup the gradient coils may be a pair of antiparallel elongated and effectively flat coils and another pair of long antiparallel solenoid-like coils. These are conventionally named the X-gradient and Y-gradient coils, where X and Y represent perpendicular coordinates in the plane of a selected layer. Spatial resolution within a selected layer is achieved using the controlled non-uniform magnetic fields generated by the gradient coils (P. T. Callaghan, *Principles of Nuclear Magnetic Resonance Microscopy*, Clarendon Press, Oxford, 1991).

Coil 50 provides RF excitation energy and receives magnetic resonance signals. Coil 50 is inductively or capacitively coupled to excitation 69 and receiver 60 elements. The coil is connected by cable 57 to quarter-wave tuning or duplexer unit 80. For the present embodiment, quarter-wave tuning is achieved with a set of capacitors and relays to protect receiver circuit 60 during RF excitation. Other configurations may be used to protect the receiver circuit. Coil 50 could, for example, comprise a multiple-turn spiral element, coupled to a loop connected to cable 57. Induced magnetic resonance signals from sample 4 are directed to receiver circuit 60 for amplification. The signal is collected by data acquisition unit 81 for processing in a known manner and display on output 82. Input 70 may be any type of device, which activates or deactivates the FIG. 3 circuitry, or it could be more inclusive and provide signals and controls such as might be provided by an alphanumeric keyboard or even a microprocessor. The RF power is provided by RF input 69. Outputs may be of any visible or audible type, or both, and are indicated by output 82.

Control unit 59 in a preferred form comprises a computer or microprocessor including a program for selecting steps out of the options described below. Coils 48, 49, and 50 are preferably covered by a protective insulating layer. Many different forms of RF coil unit 50 may be provided. It is not necessary, for example, to have separated excitation and receiving coils.

FIG. 5 is a schematic illustration of tuning circuit 58 shown in FIG. 3 in block form. A plurality of capacitors 72 are providing for selecting the resonance frequencies for tuned coil 50. In the present embodiment, six capacitors, denoted 72-1 through 72-6, are provided, each connected in series with one of a plurality of corresponding switching devices, for example, relays 74-1 through 74-6. The relays are connected to relay driver 76, which receives signals from control unit 59. The relays 74 are selectively closed to connect capacitors 72 across tuned coil 50. A single frequency is defined by the LC combination of the selected capacitor 72 and tuned coil 50, and that frequency corresponds to one layer in the sensitive volume 6. The tuning capacitances can be computed to target equal increments between successive planes, or layers 7 (FIG. 1), in sensitive volume 6, in which resides sample 4. Solid-state switches maybe used as alternatives to relays.

Figure 6:
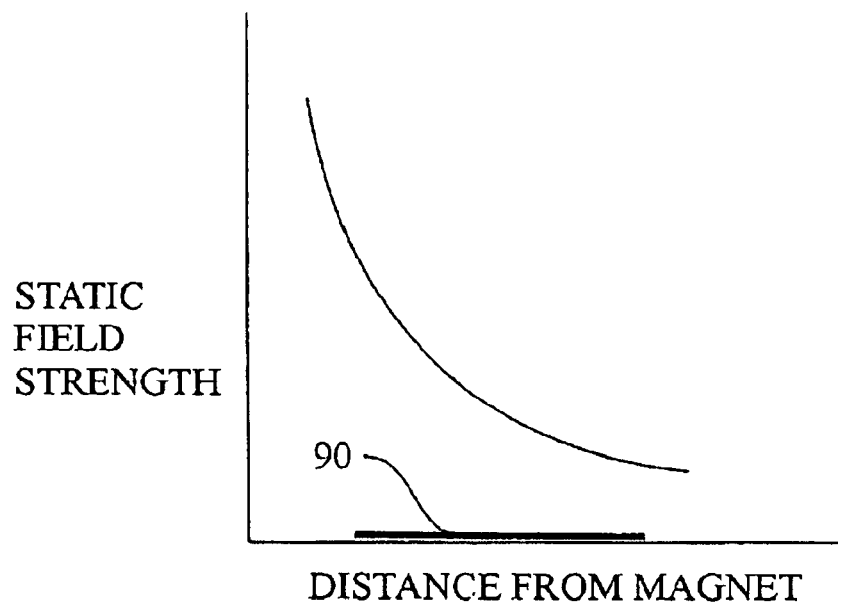
FIG. 6 is a graph useful in understanding selection of a sensitive volume slice for analysis.

The relationship between frequency and selection of a layer 7 (FIG. 1) is further qualitatively illustrated with respect to FIG. 6, which is a graph of relative field strength versus distance from the top of magnet assembly 12 (FIGS. 1 and 4). Resonant frequency is proportional to field strength so higher frequencies are observed closer to magnet assembly 12 and coil 50. The abscissa represents distance from the coil, and the ordinate is a dimensionless scale of relative magnetic field strength. As the resonant frequency is switched to lower values, the layer 7 to which the MRI apparatus responds increases in distance from magnet assembly 12. The sensitive volume 6 is represented as a region 90 with monotonically decreasing field strength with the distance from the magnet array.

Figure 7A:
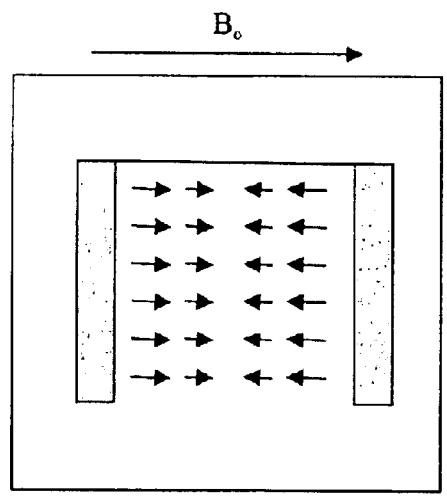
FIG. 7 shows the spatial distribution of the magnetic fields produced by the gradient coils.
Figure 7B:
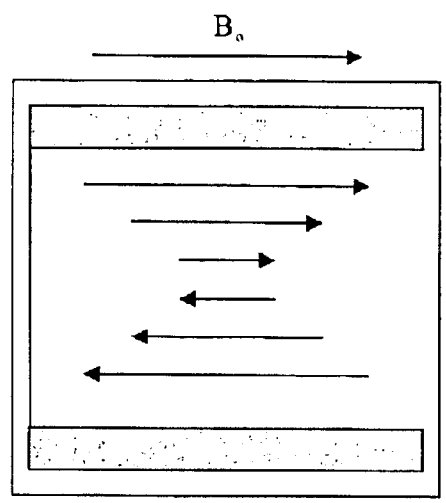

FIG. 7 represents the spatial distribution of the magnetic fields produced by the gradient coils. The direction of the static magnetic field $B_0$ is indicated above each diagram. The arrows represent the monotonic change of the field in the two perpendicular directions over the plane parallel to the static field $B_0$. FIGS. 7A and 7B shows the field distribution generated by the gradient coils. The fields in FIG. 7A are used for spatial resolution along the direction of the static field, while the fields in FIG. 7B are used for spatial resolution across the direction of the static field. This allows for two-dimensional in-plane imaging. An alternative method to achieve spatial resolution over these directions is by using non-uniform RF fields, a technique known as Rotating Frame Imaging.

Figure 8:
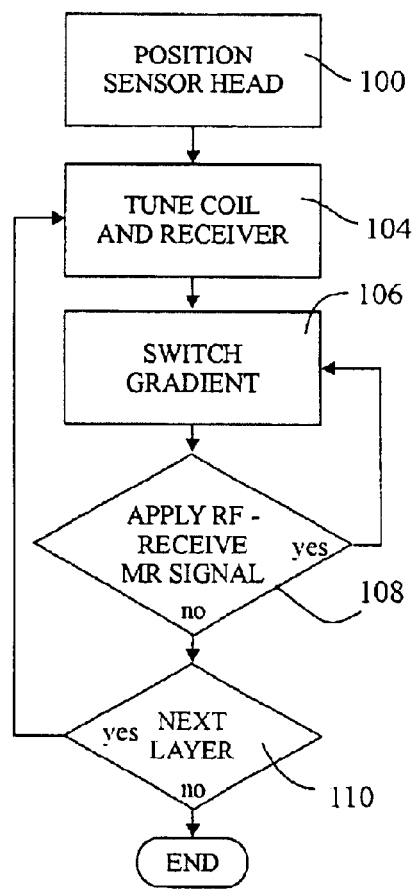
FIG. 8 is a flow diagram illustrating a method performed in accordance with the present invention.

Operation of MRI apparatus 1 is represented in FIG. 8, which is a flow chart. At block 100, sample 4 is introduced into sensitive volume 6, by either moving the sample close to the sensor head or positioning the sensor head close to the sample. The sample may rest on probe support block 52 or be otherwise supported. The support block may also rest on the sample. At block 104, coil 50 is tuned so that the MRI apparatus will respond to a selected layer 7. At block 106, gradient coils 48 and 49 are switched with a selected current to produce a horizontal scan of selected layer 7. At block 108 MR signals are produced by a dedicated pulse sequence and then a new gradient strength is set in block 106. These signals are received by coil 50, amplified by receiver 60 and processed at data acquisition unit 81. At block 110, controller 59 inquires if a next layer 7 is to be scanned. If so, the operation returns to block 104, and coil 50 is tuned to a next selected frequency. The resonant frequency to which coil 50 is tuned is preferably shifted by an offset larger than the saturation bandwidth. Images are rendered by processing of MR signals received via coil 50 for each layer 7.

The process can be performed in various ways. An alternative operation is performed by fixing the field generated by the gradient coils and scanning all layers, then shifting the gradient and repeating the steps until all the preset gradient values are scanned. The gradient coils may be a single set for spatial resolution in one of the horizontal directions, or two sets for spatial resolution in the horizontal plane. Block 106 may be ignored for depth profiles by shifting the frequency. The pulse sequence scheme driven by blocks 106 and 108 may be manipulated to determine MR parameters such as $T_1$, $T_2$ and $T_{2\ effective}$ with spatial resolution. Diffusion parameters can also be computed with proper pulse sequences.

In a preferred form, signal averaging is performed. The process of FIG. 8 may be performed time-efficiently in a frequency-interleaved manner. The excitation frequency is applied to sample 4 at a first frequency, and while the signal is being recovered at the corresponding layer, the sample is excited at a next frequency. The excitation frequency can then be reset to the first or a next frequency.

The above description will enable those skilled in the art to make many departures from the specific teachings herein to provide embodiments of MRI apparatus and methods of scanning samples in accordance with the present invention. The scope of the invention is limited only by the appended claims and their equivalents.

What is claimed is:

1. A magnetic resonance imaging (MRI) apparatus comprising:

a control unit;

a magnet assembly having a first surface and providing a static magnetic field parallel to said first surface;

said magnet assembly providing a plurality of substantially flat surfaces of constant static magnetic field substantially parallel to said first surface of said magnet assembly, said static magnetic field surfaces presenting monotonically decreasing field magnitudes for successive distances from said magnet assembly;

a radio frequency (RF) unit coupled to said control unit to provide an RF excitation field intersecting said static magnetic field outside said magnet assembly;

said magnet assembly static magnetic field and said RF unit excitation field providing a sensitive volume adjacent to said first surface of said magnet assembly, said substantially flat surfaces of constant static magnetic field being in the sensitive volume;

a variable frequency RF circuit for driving said RF unit;

a set of magnetic field gradient elements coupled to said control unit and configured to scan an RF signal across said flat surfaces;

RF receiving means to acquire magnetic resonance signals from a sample in said sensitive volume; and imaging means to process the received signals and present the output of said MRI apparatus.

2. The apparatus of claim 1, wherein said RF unit comprises a probe and a support block supportable on said magnet assembly, said support block being dimensioned to fit between said magnet assembly and said sensitive volume.

3. The apparatus of claim 2, wherein said RF unit comprises flat coils supported on a surface of said support block and providing an RF field substantially perpendicular to said static magnetic field.

4. The apparatus of claim 3, and further comprising a tuning circuit, said flat coils comprising a first coil connected to said RF unit and a second coil inductively coupled thereto and tuned by said tuning circuit.

5. The apparatus of claim 1, and further comprising a tuning circuit coupled to said control unit to automatically tune said RF unit selectively to a plurality of frequencies.

6. The apparatus of claim 5, wherein said tuning circuit comprises tuning components to tune said RF unit and said RF receiving means to each of selected resonant frequencies, each resonant frequency corresponding to one of said plurality of the static magnetic field flat surfaces at selected successive distances from said magnet assembly.

7. The apparatus of claim 1, wherein said RF unit comprises a coil.

8. The apparatus of claim 1, wherein said magnetic field gradient elements set comprises a first coil set and a second coil set so arranged and configured to laterally scan a given flat surface within the sensitive volume pursuant to control signals from said control unit.

9. The apparatus of claim 1, wherein said magnet assembly is comprised of permanent magnets.

10. The apparatus of claim 1, wherein said magnet assembly is comprised of electromagnets.

11. The apparatus of claim 1, wherein each successive distance static magnetic field flat surface has monotonically reduced magnetic field strength.

12. The apparatus of claim 1, wherein said RF unit comprises a single coil for selectively transmitting and receiving signals.

13. The apparatus of claim 1, wherein said RF unit comprises a coil for transmitting signals and a separate coil for receiving signals.

14. A method for magnetic resonance imaging of a sample, the method comprising:

providing a static magnetic field by means of a magnet assembly having a first surface, the static magnetic field being parallel to the first surface of the magnet assembly;

providing a plurality of effectively flat surfaces of constant static magnetic field substantially parallel to the first surface of the magnet assembly, the magnetic field flat surfaces being at successive distances from said first surface of said magnet assembly;

providing a frequency controllable RF field intersecting the static magnetic field, thereby establishing a sensitive volume, the magnetic field surfaces being in the sensitive volume;

placing the sample in the sensitive volume;

exciting the sensitive volume with an RF signal at each of a plurality of frequencies, each frequency corresponding to resonance of the sample at each preselected distance from the magnet assembly corresponding generally to the locations of the flat surfaces;

scanning the RF signal across the flat surfaces; and receiving magnetic resonance signals from the sample in said sensitive volume.

15. The method according to claim 14, wherein exciting said sensitive volume with an RF signal at each of a plurality of frequencies comprises supplying an RF input to a coil and automatically tuning the coil.

16. The method according to claim 15, wherein automatically tuning the coil comprises exciting the coil at a first frequency corresponding to a selected one of said flat surfaces, receiving a first signal produced from the sample in response to excitation by the first frequency, and while signal is being recovered from the corresponding flat surface, repeating the excitation and receiving process over at least one different frequency, and then exciting the coil at the first frequency again and adding the corresponding received signal to the first received signal.

17. The method according to claim 14, wherein scanning of a selected said flat surface parallel to said first surface is accomplished by means of magnetic field gradient sets;

and further comprising controlling the outputs of the magnetic field gradient sets to correspond to the RF frequencies corresponding selectively to the magnetic field flat surfaces.

18. The method of claim 14, wherein each successive distance static magnetic field flat surface has monotonically reduced magnetic field strength.

19. A magnetic resonance imaging (MRI) apparatus comprising:

control means;

magnet assembly means having a first surface and providing a static magnetic field parallel to said first surface;

said magnet assembly providing a plurality of substantially flat surfaces of constant static magnetic field substantially parallel to said first surface of said magnet assembly, said magnetic field surfaces being at successive distances from said magnet assembly means;

means for applying a radio frequency (RF) field intersecting the flat surfaces;

said magnet assembly static magnetic field and said RF field providing a sensitive volume adjacent to said first surface of said magnet assembly means, said substantially flat surfaces of constant static magnetic field being in the sensitive volume;

magnetic field gradient means for scanning an RF signal across the flat surfaces;

means for receiving magnetic resonance signals from a sample in the sensitive volume; and means for providing an image corresponding to the signals from the sample.

20. The apparatus of claim 19, wherein said magnet assembly is comprised of permanent magnets.

21. The apparatus of claim 19, wherein said magnet assembly is comprised of electromagnet.

22. The apparatus of claim 19, wherein each successive distance static magnetic field flat surface has monotonically reduced magnetic field strength.

23. The apparatus of claim 19, wherein said RF unit comprises a single coil for selectively transmitting and receiving signals.

24. The apparatus of claim 19, wherein said RF unit comprises a coil for transmitting signals and a separate coil for receiving signals.

* * * * *